(12) United States Patent
Crouse et al.

(10) Patent No.: US 6,732,338 B2
(45) Date of Patent: May 4, 2004

(54) METHOD FOR COMPREHENSIVELY VERIFYING DESIGN RULE CHECKING RUNSETS

(75) Inventors: James V. Crouse, Essex Junction, VT (US); Terry M. Lowe, Fairfax, VT (US); Limin Miao, So. Burlington, VT (US); James R. Montstream, Burlington, VT (US); Norbert Vogl, Colchester, VT (US); Colleen A. Wyckoff, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 77 days.

(21) Appl. No.: 10/063,101

(22) Filed: Mar. 20, 2002

(65) Prior Publication Data

US 2003/0182643 A1 Sep. 25, 2003

(51) Int. Cl.[7] .............................................. G06F 17/50
(52) U.S. Cl. ....................... 716/4; 716/3; 716/6; 716/10
(58) Field of Search ............................... 716/3, 4, 6, 10

(56) References Cited

U.S. PATENT DOCUMENTS

| 4,527,249 | A | | 7/1985 | Van Brunt ...................... 716/4 |
|---|---|---|---|---|
| 4,763,289 | A | | 8/1988 | Barzilai et al. ................. 716/4 |
| 5,631,857 | A | | 5/1997 | Kobrosly et al. ............... 716/5 |
| 5,703,788 | A | | 12/1997 | Shei et al. ...................... 716/4 |
| 5,724,504 | A | | 3/1998 | Aharon et al. .................. 716/4 |
| 5,774,358 | A | | 6/1998 | Shrote ............................ 716/4 |
| 5,815,688 | A | | 9/1998 | Averill .......................... 716/4 |
| 6,063,132 | A | * | 5/2000 | DeCamp et al. ............... 716/5 |
| 6,212,667 | B1 | | 4/2001 | Geer et al. ...................... 716/6 |
| 6,226,716 | B1 | | 5/2001 | Bauman et al. ................. 716/4 |
| 6,574,778 | B2 | * | 6/2003 | Chang et al. ................... 716/4 |

* cited by examiner

*Primary Examiner*—Vuthe Siek
*Assistant Examiner*—Thuan Do
(74) *Attorney, Agent, or Firm*—McGinn & Gibb, PLLC; Richard M. Kotulak, Esq.

(57) ABSTRACT

A system and method for automatically creating testcases for design rule checking comprises first creating a table with a design rule number, a description, and the values from a design rule manual. Next, any design specific options are derived that affect the flow of the design rule checking, including back end of the line stack options. Then, the design rule values and any design specific options (including back end of the line stack options) are extracted into testcases. Next, the testcases are organized such that there is one library with a plurality of root cells, further comprising one root cell for checking all rules pertaining to the front end of the line, and another root cell for checking design specific options including back end of the line stack options. Finally, the DRC runset is run against the testcases to determine if the DRC runset provides for design rule checking.

20 Claims, 3 Drawing Sheets

RULE TABLE SUMMARY:

| RULE | DATABASE | RUNSET | TESTCASE | INTENT. FAILS | UNINTENT. PASSES | INTENT. PASSES | UNINTENT FAILS |
|---|---|---|---|---|---|---|---|
| GR040B | | X | | | | | |
| GR110DR | | X | | | | | |
| GR114A | | X | | | | | |
| GR120A | | X | | | | | |
| GR122A | | X | | | | | |
| GR131 | | X | 6 | 6 | | 6 | |
| GR131A | | X | 5 | 54 | | 5 | |
| GR131B | | X | 5 | 1344 | | 5 | |
| GR134A | | X | | | | | |
| GR134B | | X | | | | | |
| GR201 | | X | | | | | |
| GR209R | | X | | | | | |
| GR211 | | X | | | | | |
| GR212 | | X | | | | | |
| GR228 | | X | | | | | |
| GR229 | | X | 1 | 1 | | 1 | |
| GR250A | | X | | | | | |
| GR255 | | X | | | | | |
| GR260AR | | X | | | | | |
| GR280A | | X | | | | | |
| GR286 | | X | | | | | |
| GR2X00 | | X | 2 | 2 | | 2 | |
| GR2X00B | | X | 2 | 2 | | 2 | |
| GR2X01A | | X | 2 | 2 | | 2 | |
| GR2X01B | | X | 2 | 2 | | 2 | |
| GR2X02 | | X | 2 | 10 | | 8 | |
| GR2X04 | | X | 2 | 14 | | 8 | |
| GR2X50 | X | X | 2 | 2 | | 2 | |

FIG.3

METHOD FOR COMPREHENSIVELY VERIFYING DESIGN RULE CHECKING RUNSETS

BACKGROUND OF THE INVENTION

1. Field of the Invention

The present invention generally relates to the testing of integrated circuits, and more particularly to a computer system and process for testing an integrated circuit for compliance with its architectural design parameters.

2. Description of the Related Art

In the process of designing and manufacturing integrated circuit chips, it is important that the semiconductor manufacturing process contains a set of physical design rules for such parameters as the placement, wiring, and geometrical layout of the integrated circuit chip. Moreover, it is necessary that every chip manufactured in a particular process is checked and verified that it complies with the given design rules. Hence, protocols for design rules checking are provided to ensure that the geometric shapes of the circuits are placed in proper proximal distance from one another, because incorrect placements will lead to chip failure.

Specific design rule checks verify the shape and sizes of various circuit components that are diffused, deposited, or etched onto a chip. Additionally, design rules checking also verifies that the shapes are of the proper size, shape, and type, and furthermore, that the shapes are not placed so close together within the chip that they will not work. A conventional methodology for the design rules checking is a general purpose shapes processing program (GPSPP), that receives inputs from two files: runset and physical layout files. The runset file is a command language input file that instructs the processor executing the GPSPP how to perform the design rule checks. More specifically, the runset comprises several hundred individual checks.

When developing a design rule checking (DRC) runset for a semiconductor process, a set of layout testcases is required to verify functionality and accuracy. The task of creating testcases for DRC runsets exists across all organizations and companies that code checking runsets. The code for DRC is created based on a set of layout design rules or parameters for a particular semiconductor process. The code and testcases are both manually created. Additionally, the testcases contain shapes that represent a failing and passing condition for each rule specified in the semiconductor process. The testcases must be modified when design rule changes are made to the semiconductor process, however, modifying the testcases is a rather time consuming process.

A conventional generation and verification program called Shapediff, available from IBM Corporation, NY, USA, and disclosed in U.S. Pat. No. 6,063,132, the complete disclosure of which is herein incorporated by reference, uses the testcases to ensure that the DRC is checking properly. Shapediff summarizes the results of the DRC to show if there are any unexpected results. However, Shapediff needs to be run for every process type and the testcases need to be created for each variation on the process (for example on three metal levels instead of four; these are known as back end of the line (BEOL) metal stack options). Also, there is no guarantee that each design rule has been coded. Thus, while the Shapediff program and methodology is an extremely important and useful tool in design generation and verification, a new enhanced methodology is required to further improve on the conventional design rule checking systems.

Other conventional systems and processes teach generation and verification methodologies, such as U.S. Pat. No. 6,212,667 (teaches automatic generation of testcases to run against microarchitecture models); U.S. Pat. No. 5,774,358 (teaches rules checking using testcases); U.S. Pat. No. 4,763,289 (teaches creating a testcase sing a fault simulator); U.S. Pat. No. 6,226,716 (teaches designer generated testcases); U.S. Pat. No. 5,815,688 (teaches testing and verifying cache accesses on an out-of-order computer system using testcases); U.S. Pat. No. 5,724,504 (teaches determining an amount of coverage provided by a set of testcases); U.S. Pat. Nos. 5,703,788 and 5,631,857 (teach evaluating testcase effectiveness); and U.S. Pat. No. 4,527,249 (teaches designing a simulator to quickly run a large number of testcases), the complete disclosures of which are herein incorporated by reference. However, none of these or other conventional systems provide a manner of organizing testcases into one library, or having the testcases take into account design specific options such as back end of the line (BEOL) metal stacking options for a semiconductor process.

Therefore, there is a need for a new and improved system and methodology for automatically creating testcases (testcase files) for design rule checking for all variations of a technology quickly, efficiently, and accurately. Moreover, there is a need for a new and improved system and methodology for automatically creating testcases for design rule checking which organizes the testcases into one library having a plurality of root cells, and having the testcases take into account design specific options such as back end of the line (BEOL) metal stacking options.

SUMMARY OF THE INVENTION

In view of the foregoing and other problems, disadvantages, and drawbacks of the conventional generation and verification systems and techniques, the present invention has been devised, and it is an object of the present invention to provide a system and method for automatically creating testcases for design rule checking. Another object of the present invention is to provide a novel methodology for automatically verifying design rule checking runsets. Still another object of the present invention is to provide enhancements to the conventional Shapediff program. Yet another object of the present invention is to provide a system that will allow to not only check for unintentional fails and unintentional passes in the verification process, but will also utilize information extracted from the design manual to ensure that every rule in a manual is coded. It is still another object of the present invention to provide a methodology such that even if no testcase exists for a particular ground rule, then the system is still able to provide such information to the user. Another object of the present invention is to use both the testcases and a list of ground rules extracted from a manual to guarantee that there is code coverage for every rule.

In order to attain the objects suggested above, there is provided, according to one aspect of the invention, a novel system and methodology for verifying design rule checking runsets comprising automatically creating testcases, organizing the testcases such that there is one library with a plurality of root cells, running the design rule checking runset against the testcases; and allowing the testcases to take into account any design specific options, such as back end of the line stack metal options.

More specifically, according to the present invention, a novel method is disclosed for automatically creating testcases for design rule checking comprising the steps of first creating a table with a design rule number or identifier, a description, and the values from a design rule manual. Next, any design specific options are derived that affect the flow of the design rule checking, including back end of the line metal stack options. Then, the design rule values and any design specific options (including back end of the line metal stack options) are extracted into a testcase evaluator. The next step is to organize the testcases such that there is one library with a plurality of root cells. There is one root cell for checking all rules pertaining to the front end of the line and multiple root cells for checking design specific options including back end of the line stack options. The final step of the process involves running the DRC runset against the testcases to determine if the DRC runset provides for design rule checking.

There are several benefits of the present invention. For example, the present invention provides a novel methodology for automatically verifying design rule checking runsets. Moreover, the present invention provides enhancements to the conventional Shapediff program that will allow it to not only check for unintentional fails and unintentional passes, but will also enable it to use information extracted from the design manual, to ensure that every rule in the manual is coded. Another benefit of the present invention is that if no testcase exists for a particular ground rule, then the enhanced Shapediff program is able to provide such information to the user, which is not available in the conventional Shapediff methodology. Furthermore, according to the improvements provided by the present invention, the enhanced Shapediff 160 uses both the testcases and a list of ground rules extracted from a manual to guarantee that there is code coverage for every rule.

BRIEF DESCRIPTION OF THE DRAWINGS

The foregoing and other objects, aspects and advantages will be better understood from the following detailed description of the preferred embodiments of the invention with reference to the drawings, in which:

FIG. 3 is a table generated by the present invention;

DETAILED DESCRIPTION OF PREFERRED EMBODIMENT OF THE INVENTION

As mentioned there is a need for a new and improved methodology for automatically creating testcases (testcase files) for design rule checking. According to the present invention, a method is disclosed for automatically creating testcases by extracting rule values as well as the back end of the line metal stack options. These stack options represent the valid number and levels of metal allowed for a given technology, and define the order in which they are to be processed. By using the values and stack options, the present invention quickly and accurately creates a testcase for most rules in a manual, and organizes them into different root cells.

The root cells are each run separately, and represent the complete testing of the front end rules, and each combination of the back end stack options. Because the time to modify the testcases to allow the design rule checking (DRC) results to be easily reviewed using a new and improved Shapediff methodology is shorter, according to the present invention, higher quality runsets in several DRC languages are available more quickly. The present invention also provides cross-checking capabilities through an improved modification of the conventional Shapediff program. Thus, by adding an enhancement to the conventional Shapediff program and creating a new and improved Shapediff program, the runset itself will be evaluated, thereby creating a method which verifies that every rule has been coded.

Figure 1:
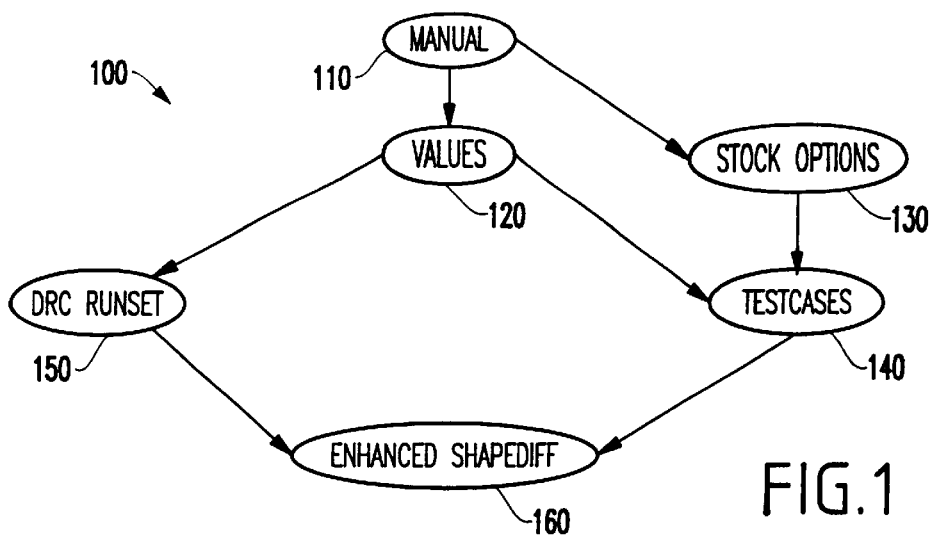
FIG. 1 is a flow diagram illustrating a preferred embodiment of the present invention.

Referring now to the drawings, and more particularly to FIGS. 1–4, there are shown preferred embodiments of the method and system according to the present invention. FIG. 1 illustrates a flow diagram of a preferred embodiment of the present invention. The system 100 comprises a manual protocol 110 operatively connected to a values protocol 120 and a stack options protocol 130. The values protocol 120 is operatively connected to the testcases protocol 140 and the DRC runset protocol 150. The stack options protocol 130 is operatively connected to the testcases protocol 140. Both the testcases protocol 140 and the DRC runset protocol 150 are connected to the Enhanced Shapediff program protocol 160.

Figure 2:
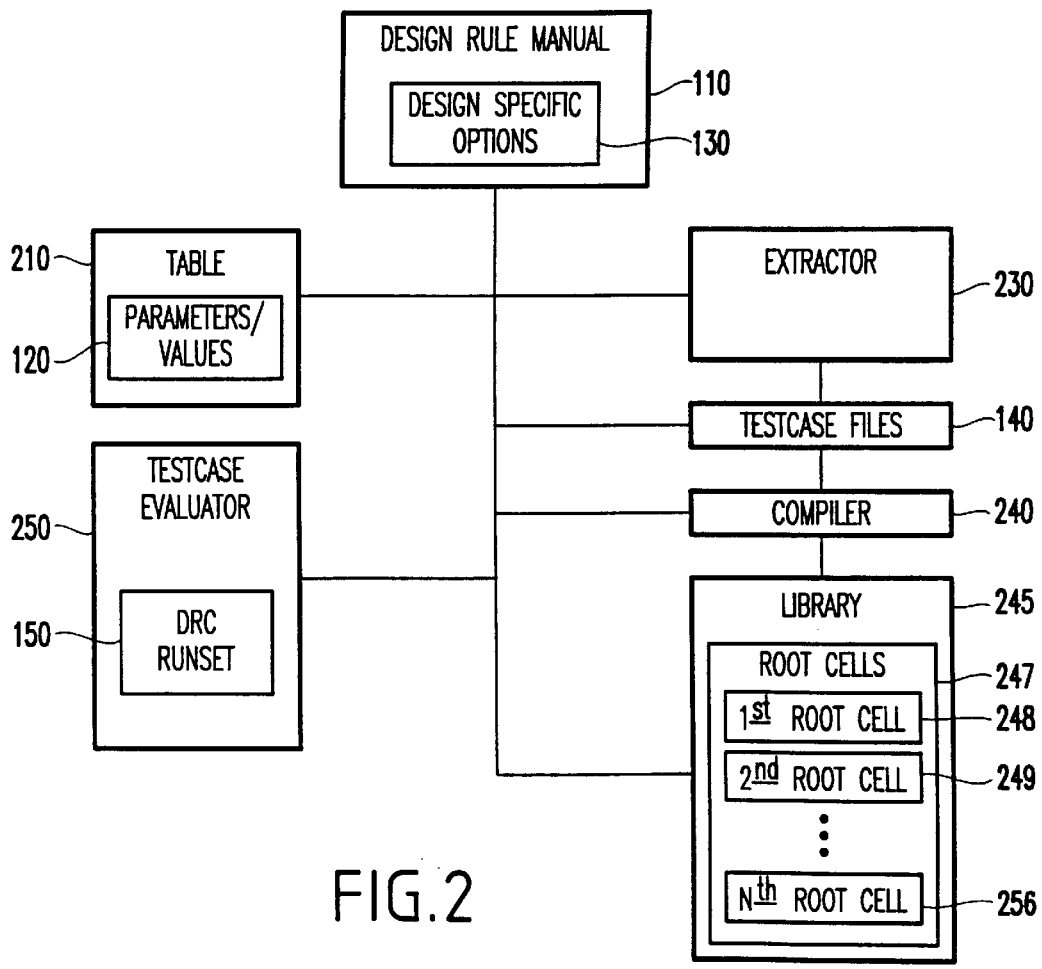
FIG. 2 is a system diagram of the present invention.

FIG. 2 illustrates the system 100 for automatically creating testcases (testcase files) 140 for design rule checking according to the present invention. The system 100 comprises a design rule manual 110, wherein the design rule manual 110 comprises design specific options protocols 130. The system 100 further comprises a table 210 generated from the design rule manual 110, wherein the table 210 comprises parameters (values) 120 such as design rule numbers, design rule descriptions, and design rule values. Also, the system 100 is shown comprising an extractor 230 that extracts the design rule values 120 and the design specific options protocols 130 into testcases 140. Additionally, the system 100 comprises a compiler 240 that organizes the testcases 140 into a library 245. Finally, a testcase evaluator 250 is included that compares a design rule checking runset 150 against the testcases 140 to determine if the design rule checking runset 150 provides sufficient design rule checking. The library 245 comprises a plurality of root cells 247, wherein the root cells further comprise a first root cell 248 for checking all rules pertaining to a FEOL (front end of the chip manufacturing processing line), and a second root cell 249 for checking the design specific options 130 pertaining to said BEOL (back end of the chip manufacturing processing line) stack options.

According to the present invention, the testcases 140 and DRC code 150 and are generated based on the specific semiconductor process design rules. The rules from the manual 110 are used to create the table 210 with the design rule number, the description, and the values 120 associated with the design rule. This table 210 is used to create approximately 90% of the testcases 140 as well as the DRC code 150. The remaining rules are rather complicated, and thus must be generated manually. However, the automated table 210, according to the present invention, represents a significant improvement in the amount of automated testcases 140 and DRC code 150 created.

The back end stack options 130 are also derived from the manual 110. These stack options 130 are combined with other design specific options 130 that affect the flow of the DRC. For example, if the targeted design data represents a cell (as opposed to an entire chip), then some of the design rules must be excluded in order to achieve a proper result.

The testcases 140 that are generated from the manual 110 are organized into one library 245 that contains multiple root cells 247. In doing so, the individual testcase files 140 can be created once and reused as necessary in the different root cells 248,249,256. For example if one design rule is required for two different BEOL (back end of [the semiconductor chip processing] line) stack options, the testcase for the particular rule would be created once, and then instantiated into the two separate root cells that require it.

A first root cell 248 checks all rules pertaining to the front end of the line since these rules are not dependent on any stack option, or design-dependent option settings. Each of the other root cells 249,256 or subsets, check a different combination of stack and design dependent options. The naming convention of the subcells indicate the technology and the necessary options that must be set for the DRC run 150.

The typical naming convention for the subcells would follow the following pattern: <technology>_<# of metal levels>_<last level of metal>_<wirebond or flip-chipbuild> where <technology> indicates which technology that the DRC runset 150 is being coded for; <# of metal levels> indicates how many metal levels in the BEOL stack, <last level of metal> indicates the final metal level on the BEOL stack, and <wirebond or flip-chip> indicates the type of terminal connection, where each of these variables are an environment variable required for the DRC runset 150.

The benefit of the subsets of testcases 140 is that they will increase the speed of the DRC 150 and the DRC verification by reducing redundant checks between DRC options. The object is to test each one of the conditional paths, such that the DRC 150 will be run for each root cell 248,249,256 that exists in the library 245. Shapediff 160 then creates a log file that contains a table that lists each ground rule, and indicates that the rule was in the original table 210 extracted from the manual 110, that a testcase file 140 existed and that the DRC runset 150 contained code for that rule. This table is included as FIG. 3.

Another object is to make sure each ground rule check is exercised with a passing and a failing testcase. The testcases are laid out such that fails are expected on the left hand side of the y-axis, and passes on the right hand side. When DRC 150 is run on the different root cells 248,249,256 Shapediff 160 will keep track of all intentional fails and passes, as well and any unintentional fails and passes that can indicate a problem with the DRC code. This data is stored in the table in the log file that Shapediff 160 produces. This table is shown in FIG. 3.

Enhancements are made to the conventional Shapediff program that will allow it to not only check for unintentional fails and unintentional passes, but will also enable it to use information extracted from the design manual 110, to ensure that every rule in the manual 110 is coded. One benefit of the present invention is that if no testcase exists for a particular ground rule, then the enhanced Shapediff program is able to provide such information to the user, which is not available in the conventional Shapediff methodology.

Because the conventional Shapediff is not able to provide any information to the user if no testcase exists for a particular ground rule, this creates problems when the runset coder does not notice a new rule, and therefore does not draw a corresponding testcase. However, according to the improvements provided by the present invention, the enhanced Shapediff 160 uses both the testcases 140 and a list of ground rules extracted from the manual 110 to guarantee that there is code coverage for every rule. This is conveyed to the user through the use of the table in FIG. 3. Ideally, the Database, Runset and Testcase columns would all be filled in, indicating that the rule existed in the manual, was coded in the runset, and had a testcase file available. Any blank column would indicate a problem. This cross-checking capability of the enhanced Shapediff 160 further guarantees the completeness of the deck.

As previously mentioned, the conventional Shapediff program is used to check the quality of the code by flagging unintentional fails and passes. However, the completeness of the deck has always been left to the coder to verify. Also, in the conventional programs, generating the testcases has been slow and unorganized. By using the present methodology, testcases may be generated for all variations of a technology quickly and efficiently, increasing the quality and reducing the turn around time (TAT) of the DRC runset verification process. The present invention ensures speed and accuracy by reducing the amount of redundant checking through the organization of the testcases into multiple root cells, as well as ensuring that the DRC coded for every valid BEOL stack options has been updated, coded and tested. Hence, the faster creation of quality DRC runsets 150 enables circuit design layout to start much earlier and with less rework necessary caused by runset errors. Furthermore, any changes in the design rule manual 110 are incorporated more quickly into the DRC runset 150 and made available to the designers due to the new methodology in the DRC creation process.

Figure 4:
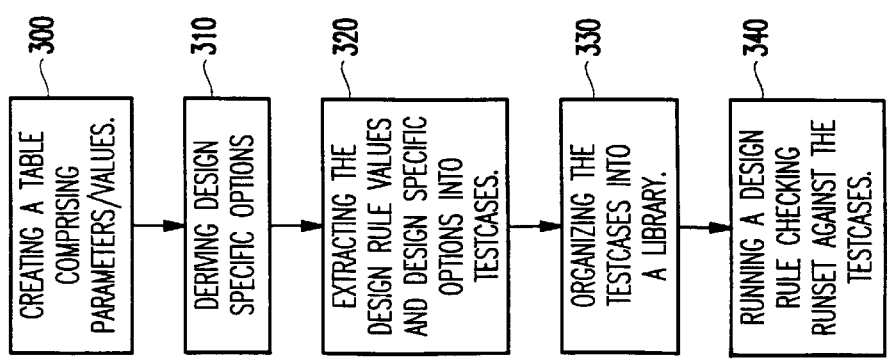
FIG. 4 is a flow diagram illustrating a preferred method according to the present invention.

FIG. 4 illustrates a flow diagram of the preferred method of automatically creating testcases 140 for design rule checking according to the present invention. The method comprises first creating 300 a table 210 comprising parameters (values) 120 such as a design rule number or identifier, a design rule description, and a design rule value, which are generated from a design rule manual 110. Next, design specific options 130 are derived 310 from the design rule manual 110. Then, the design rule values 120 and the design specific options 130 are extracted 320 into testcase files (testcases) 140. Upon completion of this step, the testcase files 140 are organized 330 into a library 245. Finally, a design rule checking runset 150 is run 340 against the testcase files 140 to determine if the design rule checking runset 150 provides for sufficient design rule checking. The design specific options 130 include BEOL (back end of the line) stack options and affect the flow of the design rule checking.

Figure 5:
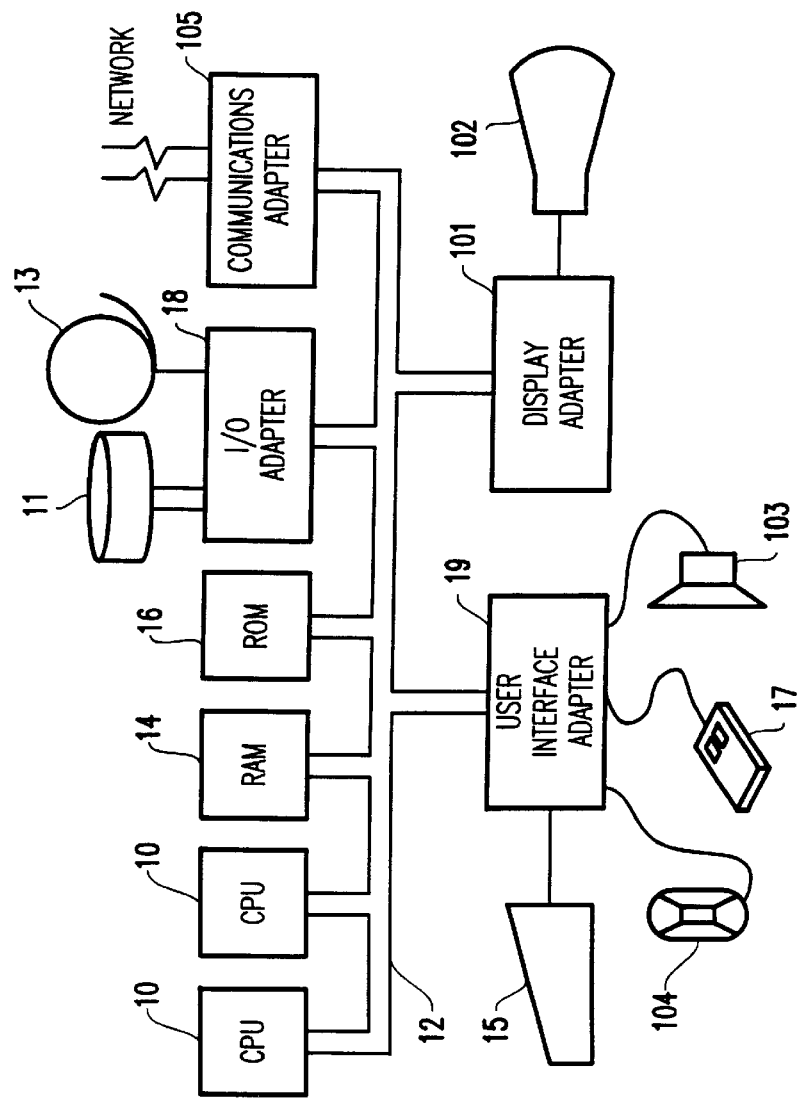
FIG. 5 is a system diagram of the present invention.

A representative hardware environment for practicing the present invention is depicted in FIG. 5 which illustrates a typical hardware configuration of an information handling/computer system in accordance with the present invention, having at least one processor or central processing unit (CPU) 10. The CPUs 10 are interconnected via system bus 12 to random access memory (RAM) 14, read-only memory (ROM) 16, an input/output (I/O) adapter 18 for connecting peripheral devices, such as disk units 11 and tape drives 13, to bus 12, user interface adapter 19 for connecting keyboard 15, mouse 17, speaker 103, microphone 104, and/or other user interface devices such as a touch screen device (not shown) to bus 12, communication adapter 105 for connecting the information handling system to a data processing network, and display adapter 101 for connecting bus 12 to display device 102. A program storage device readable by the disk or tape units is used to load the instructions, which operate the invention, which is loaded onto the computer system.

There are several benefits of the present invention. For example, the present invention provides a novel methodology for automatically verifying design rule checking runsets. Moreover, the present invention provides enhancements to the conventional Shapediff program that will allow it to not only check for unintentional fails and unintentional passes, but will also enable it to use information extracted from the design manual, to ensure that every rule in the manual is coded. Another benefit of the present invention is that if no testcase exists for a particular ground rule, then the enhanced Shapediff program is able to provide such information to the user, which is not available in the conventional Shapediff methodology. Furthermore, according to the improvements provided by the present invention, the enhanced Shapediff 160 uses both the testcases and a list of ground rules extracted from a manual to guarantee that there is code coverage for every rule.

While the invention has been described in terms of preferred embodiments, those skilled in the art will recognize that the invention can be practiced with modification within the spirit and scope of the appended claims.

What is claimed is:

1. A method for automatically creating testcases for design rule checking, said method comprising:
   creating a table comprising parameters including a design rule identifier, a design rule description, and a design rule value from a design rule manual;
   deriving design specific options from said design rule manual;
   extracting said design rule value and said design specific options into testcases comprising shapes representing pass and fail conditions for each ground rule extracted from said design rule manual;
   organizing said testcases into a library;
   running a design rule checking runset against said testcases to determine if said design rule checking runset provides for design rule checking; and
   indicating in said table whether said testcases exist for a particular ground rule.

2. The method of claim 1, wherein said design specific options affect a flow of said design rule checking.

3. The method of claim 1, wherein said library comprises a plurality of root cells.

4. A method for automatically creating testcases for design rule checking, said method comprising:
   creating a table comprising parameters including a design rule identifier, a design rule description, and a design rule value from a design rule manual;
   deriving design specific options from said design rule manual;
   extracting said design rule value and said design specific options into testcases;
   organizing said testcases into a library; and
   running a design rule checking runset against said testcases to determine if said design rule checking runset provides for design rule checking,
   wherein said design specific options include BEOL (back end of the line) stack options.

5. A method for automatically creating testcases for design rule checking, said method comprising:
   creating a table comprising parameters including a design rule identifier, a design rule description, and a design rule value from a design rule manual;
   deriving design specific options from said design rule manual;
   extracting said design rule value and said design specific options into testcases;
   organizing said testcases into a library; and
   running a design rule checking runset against said testcases to determine if said design rule checking runset provides for design rule checking,
   wherein said library comprises a plurality of root cells, and
   wherein said root cells further comprise a first root cell for checking all rules pertaining to a FEOL (front end of the line), and a second root cell for checking said design specific options pertaining to said BEOL (back end of the line) stack options.

6. A method for verifying design rule checking runsets, said method comprising:
   automatically creating reusable testcase files comprising shapes representing pass and fail conditions for a rule specified in a semiconductor process;
   organizing said testcase files such that there is one library further comprising a plurality of root cells; and
   running a design rule checking runset against said testcase files; and
   indicating whether said testcase files exist for a particular rule.

7. The method of claim 6, wherein said testcase files comprise a set of design rule values and a set of design specific options.

8. The method of claim 7, wherein said design specific options affect a flow of said design rule checking.

9. The method of claim 6, wherein said root cells further comprise a first root cell for checking all rules pertaining to a FEOL (front end of the line), and a second root cell for checking said design specific options pertaining to said BEOL (back end of the line) stack options.

10. A method for verifying design rule checking runsets, said method comprising:
    automatically creating testcase files;
    organizing said testcase files such that there is one library further comprising a plurality of root cells; and
    running a design rule checking runset against said testcase files,
    wherein said testcase files comprise a set of design rule values and a set of design specific options, and
    wherein said design specific options include BEOL (back end of the line) stack options.

11. A system for automatically creating testcase files for design rule checking comprising:
    a design rule manual, wherein said design rule manual comprises design specific options;
    a table generated from said design rule manual, wherein said table comprises design rule identifiers, design rule descriptions, and design rule values;
    an extractor that extracts said design rule values and said design specific options into testcase files, wherein said testcase files comprise shapes representing pass and fail conditions for each ground rule extracted from said design rule manual;
    a compiler that organizes said testcase files into a library; and
    a testcase evaluator that compares a design rule checking runset against said testcase files to determine if said design rule checking runset provides for design rule checking,
    wherein said table indicates whether said testcase files exist for a particular ground rule.

12. The system of claim 11, wherein said design specific options affect a flow of said design rule checking.

13. The system of claim 11, wherein said library comprises a plurality of root cells.

14. A system for automatically creating testcase files for design rule checking comprising:

a design rule manual, wherein said design rule manual comprises design specific options;

a table generated from said design rule manual, wherein said table comprises design rule identifiers, design rule descriptions, and design rule values;

an extractor that extracts said design rule values and said design specific options into testcase files;

a compiler that organizes said testcase files into a library; and a testcase evaluator that compares a design rule checking runset against said testcase files to determine if said design rule checking runset provides for design rule checking, wherein said design specific options include BEOL (back end of the line) stack options.

15. A system for automatically creating testcase files for design rule checking comprising:

a design rule manual, wherein said design rule manual comprises design specific options;

a table generated from said design rule manual, wherein said table comprises design rule identifiers, design rule descriptions, and design rule values;

an extractor that extracts said design rule values and said design specific options into testcase files;

a compiler that organizes said testcase files into a library; and a testcase evaluator that compares a design rule checking runset against said testcase files to determine if said design rule checking runset provides for design rule checking, wherein said library comprises a plurality of root cells, and wherein said root cells further comprise a first root cell for checking all rules pertaining to a FEOL (front end of the line), and a second root cell for checking said design specific options pertaining to said BEOL (back end of the line) stack options.

16. A program storage device readable by machine, tangibly embodying a program of instructions executable by said machine to perform a method for automatically creating testcases for design rule checking, said method comprising:

creating a table comprising parameters including a design rule identifier, a design rule description, and a design rule value from a design rule manual;

deriving design specific options from said design rule manual;

extracting said design rule value and said design specific options into testcases comprising shapes representing pass and fail conditions for each ground rule extracted from said design rule manual;

organizing said testcases into a library;

running a design rule checking runset against said testcases to determine if said design rule checking runset provides for design rule checking; and indicating in said table whether said testcases exist for a particular ground rule.

17. The program storage device of claim 16, wherein said design specific options affect a flow of said design rule checking.

18. The program storage device of claim 16, wherein said library comprises a plurality of root cells.

19. A program storage device readable by machine, tangibly embodying a program of instructions executable by said machine to perform a method for automatically creating testcases for design rule checking, said method comprising:

creating a table comprising parameters including a design rule identifier, a design rule description, and a design rule value from a design rule manual;

deriving design specific options from said design rule manual;

extracting said design rule value and said design specific options into testcases;

organizing said testcases into a library; and running a design rule checking runset against said testcases to determine if said design rule checking runset provides for design rule checking, wherein said design specific options include BEOL (back end of the line) stack options.

20. A program storage device readable by machine, tangibly embodying a program of instructions executable by said machine to perform a method for automatically creating testcases for design rule checking, said method comprising:

creating a table comprising parameters including a design rule identifier, a design rule description, and a design rule value from a design rule manual;

deriving design specific options from said design rule manual;

extracting said design rule value and said design specific options into testcases;

organizing said testcases into a library; and running a design rule checking runset against said testcases to determine if said design rule checking runset provides for design rule checking, wherein said library comprises a plurality of root cells, and wherein said root cells further comprise a first root cell for checking all rules pertaining to a FEOL (front end of the line), and a second root cell for checking said design specific options pertaining to said BEOL (back end of the line) stack options.

* * * * *